April 29, 1969 C. PARADINE 3,441,746
CLOCKED BISTABLE TUNNEL-DIODE LOGIC CIRCUIT
Filed Oct. 21, 1965
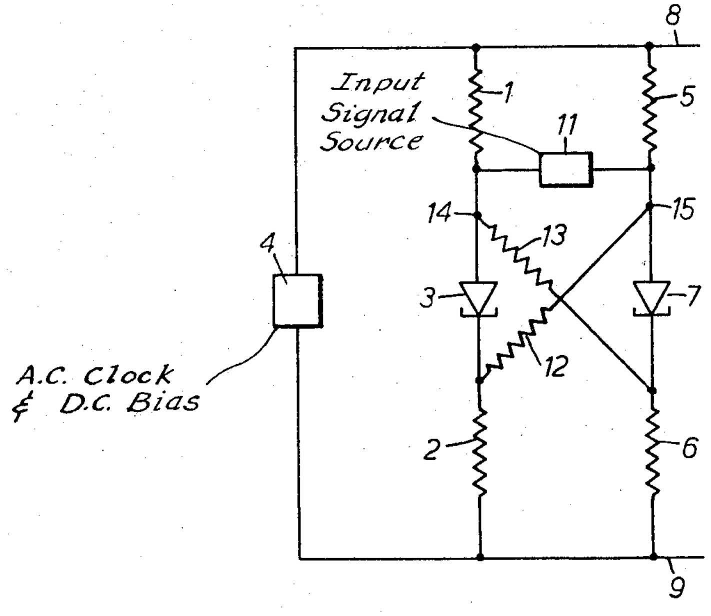
INVENTOR
Christopher Paradine
BY [signature]
ATTORNEY United States Patent Office 3,441,746

Patented Apr. 29, 1969

3,441,746
CLOCKED BISTABLE TUNNEL-DIODE LOGIC CIRCUIT

Christopher Paradine, London, England, assignor to Elliott Brothers (London) Limited, London, England, a British company Filed Oct. 21, 1965, Ser. No. 500,134
Claims priority, application Great Britain, Oct. 23, 1964, 43,245/64
Int. Cl. H03k *19/10*
U.S. Cl. 307—206 1 Claim

ABSTRACT OF THE DISCLOSURE

A tunnel diode logic circuit comprises two tunnel diodes connected in parallel between two supply lines which are energised in anti-phase so as periodically to switch both tunnel diodes into their active state, and an input signal source which produces an input signal for switching one diode from the active state into one stable state and for switching the other diode from the active state into the other stable state according to the polarity of the input signal.

The invention relates to logic circuits employing tunnel diodes.

According to one aspect of the invention, there is provided a logic circuit, including two tunnel diodes each having two stable states and connected in parallel across two supply lines arranged to be connected to a source of potential difference, switching means responsive to an input signal for changing the stable state of one of the diodes, and feedback means interconnecting the two diodes to prevent the other of the diodes from changing its stable state in response to the said input signal.

According to another aspect of the invention, there is provided a logic circuit including two tunnel diodes, each having two stable states and an intermediate active state, the diodes being connected in parallel between two supply lines arranged to receive alternating anti-phase voltages for periodically switching the tunnel diodes into the active state, means responsive to an input signal for switching one diode from the active state into one stable state and for switching the other diode from the active state into the other stable state, and means for producing an output from the said circuit representative of the states of the diodes.

One example of a logic circuit according to this invention will now be described with reference to the accompanying circuit diagram.

The circuit diagram illustrates a source 4 for respectively supplying two high frequency anti-phase signals to two supply lines 8 and 9, which signals may be regarded as "pump" or "clock" signals. The source 4 also produces a D.C. bias signal across the two supply lines. Connected between the two supply lines are two resistors 1 and 2 having a tunnel diode 3 connected therebetween, and two resistors 5 and 6 having a tunnel diode 7 connected therebetween. The resistors all have the same value and the tunnel diodes are a matched pair.

These two tunnel diodes are interconnected by a negative feedback network comprising a resistor 12 connected between the cathode electrode of the tunnel diode 3 and the anode electrode of the tunnel diode 7, and a resistor 13 connected between the cathode electrode of the tunnel diode 7 and the anode electrode of the tunnel diode 3. In addition, a input signal source 11 interconnects the anode electrodes of the two tunnel diodes 3 and 7, this source 11 being adapted to produce a signal for determining the operational state of the tunnel diodes, as described below.

In describing the operation of this logic circuit it will be assumed initially that the voltage difference between the supply lines 8 and 9 is such that both the tunnel diodes will be in their low voltage region representing one stage of conduction.

Subsequently, as a potential difference is developed across the supply lines by the anti-phase signals from the source 4, the tunnel diodes will be driven from their stable low voltage region to their unstable (active) negative resistance region and, since the resistors 1, 2, 5 and 6 have equal values and the tunnel diodes 3 and 7 are matched so that they have the same current-voltage characteristics, the two tunnel diodes will become "active" at substantially the same time. If however a small externally generated current is applied from the input signal source 11, then either the tunnel diode 3 or the tunnel diode 7 will be activated before the other, in dependence on the sense of this current. Thus, as the earlier activated diode begins to switch into its high voltage region, representing the other state of conduction, the feedback resistors 12 and 13 become operative to inhibit the switching of the other tunnel diode. Thus, the circuit can exhibit only one stable state under these conditions, one of the tunnel diodes being switched into its high voltage state, and the other settling back into its initial low voltage state.

Thus, a voltage will be developed between terminals 14 and 15 and if terminals 14 and 15 are connected by two resistors to corresponding points in another similar logic circuit then logical information can be transferred from one circuit to the other circuit. In such a case, the one circuit provides the input signal source 11 of the other circuit. In order for transfer of logical information to occur the voltage across the supply lines in the other logic circuit should lag in phase behind the voltage developed across the supply lines 8 and 9, preferably by 120°.

In particular, a logical operation can be performed by the other circuit by, for example, having three logic circuits connected in common to this other circuit through three pairs of resistors connected to terminals corresponding to terminals 14 and 15, the logical operation performed by the other circuit being, for example, a majority function.

The operation of the circuit described above is that which is normally realised, namely, the condition where both diodes are initially in the low voltage state and one of these is subsequently switched into the high voltage (storing) state. Alternatively however, both diodes may initially be in the high voltage state and one of these diodes may subsequently be switched into the low voltage (storing) state. In the "storing" state of the logic circuit, the diodes effectively become two logic elements which hold only inverse or complementary information.

One logic circuit of the kind described, was made with components having the following values and the following operating parameters:

| | | |
|---|---|---|
| Resistors 1, 2, 5, 6 | ohms | 100 |
| Resistors 12, 13 | do | 10 |
| Tunnel diodes (Germanium-STC JK 30): | | |
| Peak current | ma | 5 |
| Peak voltage | mv | 55 |
| Voltage on line 8 | volts | *0—+4 |
| Voltage on line 9 | do | *0—4 |

*50 mc./s. sine wave anti-phase.

The two coupling resistors from the terminals 14 and 15 of one circuit to the other following circuit may each have a value of 200 ohms.

With the operational parameters given above, the circuit loop comprising the two tunnel diodes 3 and 7 and the resistors 12 and 13 have an input impedance corresponding to a parallel capacitance of about 60 picofarads and a series inductance of about 4 nanohenries. It is desirable that any reduction in the value of this capacitance should be accompanied by a proportional reduction in the inductance.

Such a logic circuit can thus perform inverse or complementary logical functions and overcome what has hitherto been a disadvantage of tunnel diode logic circuits, namely that whilst the circuits may perform true logical operation additional circuitry is required to perform the logical operation of inversion. With a circuit according to this invention, the direction of transfer may be ensured by employing a multiphase supply from the source 4 so that coupled logic circuits are switched in a predetermined order.

A power gain may readily be realised from a circuit according to this invention by reason of the anti-phase supply to the tunnel diodes which results in the energy required to switch the circuits being less than that which can be taken from the circuit.

If an alternating clock or pump supply is not provided, the circuit may alternatively be employed as a D.C. bistable circuit.

In addition, although the circuit described employs resistors for activation of the tunnel diodes and for the feedback loop, other components may alternatively be employed. In particular, the tunnel diodes may be coupled capacitively or inductively or through further tunnel diodes, backward diodes or ordinary diodes.

It will be appreciated that the logical functions performed by two circuits as described, when interconnected by two lines, are substantially unaffected by any current which flows in the same direction along both lines.

Two circuits as described need not be interconnected through the terminals 14 and 15. Instead, they may be interconnected through any other symmetrical pair of points in the circuit, for example, the mid-points of resistors 12 and 13.

Interconnection of two circuits should be via screened or unscreened twin transmission lines if the distance covered is not negligible compared with the wavelength of the alternating signals from the source 4.

In a physically large system involving general interconnected logic circuits, it may be necessary to interconnect the circuits through interconnections of the same length.

I claim:

1. A logic circuit including a pair of supply lines,
a first tunnel diode having an anode and a cathode,
a first resistor connected between one supply line and the said anode, a second resistor connected between the other supply line and the said cathode,
a second tunel diode having an anode and a cathode,
a third resistor connected between the said one supply line and the anode of the second tunnel diode,
a fourth resistor connected between the said other supply line and the cathode of the second tunnel diode,
the first, second, third and fourth resistors having substantially the same resistance value and each tunnel diode being capable of assuming a low voltage stable state, a high voltage stable state and an intermediate unstable active state,
a fifth resistor connected between the anode of the first tunnel diode and the cathode of the second tunnel diode,
a sixth resistor connected between the anode of the second tunnel diode and the cathode of the first tunnel diode,
the fifth and sixth resistors having substantially the same resistance value,
a first source of D.C. potential,
means connecting the said first source to the first and second supply lines to bias the first and second tunnel diodes into the said low voltage stable state,
a second source providing two alternating anti-phase voltages,
means connecting the second source across the first and second supply lines for respectively applying the anti-phase voltages to the two supply lines to periodically switch the first and second diodes into the said unstable state,
a third source producing an input current,
and means feeding the input current from the anode of one diode to the anode of the other diode in such a direction as to switch one of the said tunnel diodes from the unstable state into the high voltage stable state,
the fifth and sixth resistors providing a feedback path to cause the other tunnel diode to be switched from the unstable state back into the low voltage stable state.

References Cited

UNITED STATES PATENTS

| | | | |
|---|---|---|---|
| 2,920,215 | 1/1960 | Lo | 307—291 X |
| 3,122,649 | 2/1964 | Roop | 307—323 X |

ARTHUR GAUSS, *Primary Examiner.*

DONALD D. FORRER, *Assistant Examiner.*

U.S. Cl. X.R.

307—208, 269, 274, 286